US 6,576,061 B1

(12) United States Patent
Moriyama et al.

(10) Patent No.: US 6,576,061 B1
(45) Date of Patent: Jun. 10, 2003

(54) APPARATUS AND METHOD FOR PROCESSING A SUBSTRATE

(75) Inventors: Koichiro Moriyama, Kyotanabe (JP); Masahiro Kanai, Tokyo (JP); Hirokazu Ohtoshi, Nara (JP); Tadashi Hori, Nara (JP); Naoto Okada, Nara (JP); Hiroshi Shimoda, Kyotanabe (JP); Hiroyuki Ozaki, Kyotanabe (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/469,797

(22) Filed: Dec. 22, 1999

(30) Foreign Application Priority Data

Dec. 22, 1998 (JP) ............................. 10-365066
Dec. 17, 1999 (JP) ............................. 11-359145

(51) Int. Cl.$^7$ ............................................. H01L 21/00
(52) U.S. Cl. ................................. 118/719; 156/345.31
(58) Field of Search ..................... 118/719; 156/345.31

(56) References Cited

U.S. PATENT DOCUMENTS 4,661,196 A * 4/1987 Hockersmith et al. . 156/345.31
5,016,562 A * 5/1991 Madan et al. ................ 118/719

* cited by examiner

Primary Examiner—Thi Dang
(74) Attorney, Agent, or Firm—Fitzpatrick, Cella, Harper & Scinto

(57) ABSTRACT

A substrate-processing method comprising transporting a substrate to pass through a plurality of processing spaces communicated with each other while processing said substrate in each processing space, characterized in that based on an inner pressure of (a) one of said plurality of processing spaces, said inner pressure of said processing space (a) and an inner pressure of (b) at least one of the processing spaces arranged before or after said processing space (a) are controlled.

A substrate-processing apparatus comprising a plurality of processing spaces, a substrate transportation means for transporting a substrate to pass through said plurality of processing spaces while said substrate being processed in each processing space, and a pressure gage of measuring an inner pressure of (a) one of said plurality of processing spaces, characterized in that said substrate-processing apparatus has a control unit for controlling the inner pressure of said processing space (a) and that of (b) at least one of the processing spaces arranged before or after said processing space (a) based on information obtained from said pressure gage.

20 Claims, 8 Drawing Sheets

APPARATUS AND METHOD FOR PROCESSING A SUBSTRATE

BACKGROUND OF THE INVENTION

1. Field of the Invention

The present invention relates to a method and apparatus for processing a substrate for use in the production of a semiconductor device (the method for processing a substrate will be hereinafter occasionally referred to as "substrate-processing method" and the apparatus for processing a substrate will be hereinafter occasionally referred to as "substrate-processing apparatus" for simplification purpose). The present invention also relates to a film-forming method and a film-forming apparatus. The film-forming method includes a film-forming method for continuously forming a deposited film on a substrate by means of plasma chemical vapor deposition (hereinafter referred to as plasma CVD) or sputtering. The film-forming apparatus includes a film-forming apparatus for continuously forming a deposited film on a substrate by means of plasma CVD or sputtering. The present invention includes a process and apparatus for producing a photovoltaic element.

2. Related Background Art

In order to form a functional deposited film on a substrate using a plurality of processing chambers (film-forming chambers), there are known a number of apparatus for continuously forming a deposited film on a belt-like shaped substrate (that is, a web substrate) to obtain a semiconductor element. As a representative example of such apparatus, there can be mentioned a film-forming apparatus for continuously forming a deposited film on a web substrate by a so-called roll-to-roll system as disclosed, for instance, in U.S. Pat. No. 4,400,409 this film-forming apparatus comprises a double-chambered structure having a plurality of film-forming chambers: provided in a plurality of processing chambers communicated with each other. In said document, there is described that elements such as semiconductor elements having a semiconductor junction can be continuously formed by continuously transporting a long web substrate having a desired width in the longitudinal direction along a route of sequentially passing through the processing chambers. In the film-forming apparatus, each film-forming chamber is provided in the corresponding processing chamber whose inside can be maintained in a vacuumed state. In order to prevent processing gas used fox the formation of a deposited film in each film-forming chamber from being diffused or contaminated into the film-forming chamber situated next thereto, a gas gate is provided between each adjacent processing chambers. The gas gate comprises a slit-like separation passage through which adjacent processing chambers are communicated, where separation gas such as Ar gas, $H_2$ gas or the like is flown into the separation passage to form a gas flow of the separation gas whereby the adjacent processing chambers are isolated one from the other. In each processing chamber, there are provided a means for introducing processing gas into the film-forming chamber provided therein, exhaust means including an exhaust pipe, a vacuum pump and the like for evacuating the inside of the film-forming chamber, means for performing plasma processing such as plasma CVD or sputtering by supplying a power energy such as high frequency power energy or the like to generate a plasma in the film-forming chamber, components of constituting the film-forming chamber, and a heating means such as a heater for heating the web substrate to a desired temperature for the film formation on the web substrate.

By using the plurality of processing chambers as above described, a plurality of deposited films each comprising a different material or having a different chemical composition can be continuously stacked on a substrate. However, as examples of the constitution of the apparatus such plural processing chambers there are considered (1) a case wherein one film-forming chamber is provided in one-processing chamber where one kind deposited film is formed on the web substrate in one processing chamber, (2) a case wherein a plurality of film-forming chambers are provided in one processing chamber where a plurality of deposited films of the same kind or similar kinds are sequentially formed on the web substrate in one processing chamber, and (3) a case wherein one of the plural processing chambers is used for heating, cooling or etching the web substrate without forming any deposited film thereon. For instance, Japanese Unexamined Patent Publication No. 191120/1997 discloses a process for producing a pin junction type photovoltaic element having improved characteristics wherein the p-type semiconductor layer is formed using a plurality of film-forming chambers which are different from each other with respect to certain condition. Particularly, in this document, there is described that using a film-forming apparatus comprising a plurality of processing chambers each having a film-forming chamber, a multi-layered semiconductor layer as the p-type semiconductor layer is formed by forming a desired deposited film in each of the film-forming chambers each provided in one of the processing chambers. It can be said that this apparatus constitution corresponds the above described case (1). Separately; in the above document, since the same processing gases (film-forming raw material gases) are in said each of the film-forming chambers for the formation of the p-type semiconductor layer, it is considered that the apparatus may take such constitution as described in the above case 2 in that all the film-forming chambers for the formation of the p-type semiconductor layer are arranged in one processing chamber.

Besides, in the case where the film formation in one film-forming chamber is difficult to achieve a desired film thickness, the desired film thickness can be achieved by arranging a plurality of film-forming chambers whose film-forming conditions are the same in one processing chamber as in the above case (2) and sequentially forming a deposited film by said plurality of film-forming chambers. Further, in the above case (2), it is possible to diminish the number of the processing chambers and that of the gas gates and therefore, the apparatus can be simplified and the cost of the apparatus can be diminished.

Incidentally, for the film-forming method by means of such roll-to-roll film-forming apparatus comprising a plurality of processing chambers communicated with each other as above described, it is suitable for mass-producing a functional deposited film or a semiconductor device such as a photovoltaic element or the like. However, particularly in order to widely spread the use of photovoltaic elements (solar cells) there is an increased demand for more improving the conventional film-forming apparatus and method so that they can stably and efficiently mass-produce a high quality photovoltaic element (solar cell) having a more improved photoelectric conversion efficiency, characteristic stability and characteristic uniformity at a reasonable production cost As one of the important factors for the conventional film-forming apparatus and method to be difficult to comply with this demand, there can be mentioned a subject that the processing chamber or the film-forming chamber has such problems as will be described below with respect to the film-forming conditions relating to the control of the exhaustion and inner pressure of said chamber.

That is, in order to control the inner pressure of the film-forming chamber by evacuating (exhausting) the inside of the film-forming chamber, there is known a method of comparing an inner pressure value measured in the processing chamber or the film-forming chamber with a predetermined objective inner pressure value using a pressure controller and regulating the opening extent of a variable valve so that they are matched. Each of FIGS. 3 and 4 shows a substrate-processing apparatus in which said method for controlling the inner pressure of the film-forming chamber (the method will be hereinafter referred to as "inner pressure-controlling method") is used.

In the case of the apparatus shown in FIG. 3, there is a problem such that the pumping speeds for gases. exhausted from the respective film-forming chambers are not balanced but varied. In the case of the apparatus shown in FIG. 4, there is a problem such that the film-forming conditions cannot be readily changed.

This situation will be described in more detail in the following.

In the case of the apparatus shown in FIG. 3, variable valves 109a–109c are connected to exhaust pipes 108a–108c of processing spaces 104a–104c (film-forming spaces) in a processing chamber 103. For instance, measured values by pressure gages 106a–106c are inputted in pressure controllers 110a–110c having a valve-controlling function to control the opening extent extents of the variable valves 109a–109c whereby the inner pressures of the film-forming spaces 104a–104c are controlled, where feedback control is independently performed for each film-forming space. For the inner pressure-controlling method adopted in the apparatus shown in FIG. 3, there is a problem such that when the opening extent extents of the variable valves 109a to 109c are varied, the pumping speeds for gases exhausted from the respective film-forming spaces are not balanced but varied accordingly.

For the reason why such problem is occurred, it is considered such that as the respective film-forming spaces are provided in the same processing chamber they are conceivable to be spatially communicated with each other and because of this, due such factors as will be described below, a difference is occurred between the actual inner pressure of the film-forming space and the pressure which is recognized by the pressure controller.

As said factors, there can be mentioned (i) a variation in the error range for the zero point or linearity of the pressure gage, (ii) a variation in the error range for the set pressure value of the pressure controller or in said set pressure value, (iii) a variation in the set pressure value due to an output drift or a temperature change of the pressure gage itself during the film-forming treatment over a long period of time, (iv) a change in the reaction state of the processing gas in the discharge space (the film-forming space) due to abnormal discharge or discharge discontinuation therein, (v) a change in the closed state of the discharge space due to mechanical vibration of the substrate, and (vi) occurrence of electrical noise which influences to the inner pressure of the discharge space (the film-forming space). Because of these factors, the actual inner pressure of a given film-forming space is varied.

Specifically, for instance in the apparatus shown in FIG. 3, in the case where the set pressure value of the pressure controller 10c is varied due to any of the foregoing factors and the actual inner pressure of the film-forming space 104b is increased, the processing gas in the film-forming space 104b is flown into the adjacent film-forming spaces 104a and 104c to increase the inner pressure of each of the film-forming spaces 104a and 104c, where each of the pressure controllers 110a and 110c actuates to enlarge the opening extent of each of the variable valves 109a and 109c so as to decrease the inner pressure of each of the film-forming spaces 104a and 104c. In a state that the inner pressures of the film-forming spaces are varied in this way, when the opening extent and closing of the variable valves are serially performed, in extreme case, there will be an occasion such that the variable valve of a given film-forming space is entirely opened while the variable valves of the adjacent film-forming spaces are entirely opened.

And because the film-forming spaces are spatially communicated with each other as above described, in a worst case, although the inner pressure value in each film-forming space is maintained at a set pressure value, there is an occasion such that processing gas supplied into a given film-forming space is exhausted through the adjacent film-forming spaces, where the processing gas is contaminated into the adjacent film-forming spaces. And even when separation gas is flown into gas gates 101, similar phenomena are liable to occur.

The above problems due to such factors as above described are liable to occur also in the case where each of the film-forming spaces is provided in a different processing chamber and the film-forming spaces are communicated with each other through a gas gate (for instance, in the case of such positional relationship as shown in FIG. 4).

Description will be made of the inner pressure-controlling method in the apparatus shown in FIG. 4.

In the apparatus shown in FIG. 4, exhaust pipes 108a–108c of processing spaces 104a–104c (film-forming spaces) provided in processing chambers 103a–103c are gathered into a single exhaust pipe which is connected to an exhaust means, and a variable valve 109 is provided at the single exhaust pipe. The opening extent of the variable valve 109 is controlled by a pressure controller 110 on the basis of an output from any of pressure gages 106a–106c to control the inner pressures of the film-forming spaces 104a–104c, where the film-forming spaces 104a–104c are exhausted (evacuated) through the gathered single exhaust pipe. In this inner pressure-controlling method, by optimizing the pumping speed of the exhaust gas flowing in each of the exhaust pipes 108a–108c by means of an orifice or the like provided in each exhaust pipe, the inner pressure of each of the film-forming spaces 104a–104c can be made to be a desired pressure value. However, in the case where the film-forming condition is changed, specifically for instance, the flow rate of processing gas in a given film-forming space is changed, there is an occasion such that the inner pressures of the film-forming spaces 104a–104c are differed or the processing gas in one of the film-forming spaces is contaminated into the adjacent film-forming spaces to make it difficult to form a desired gas flow pathway and as a result, the film-forming conditions capable of being set are limited. This means that in order to change the film-forming conditions as desired, it is occasionally necessary to modify the constitution of the apparatus. Thus, there is a drawback for the inner pressure-controlling method used in the apparatus shown in FIG. 4 such that the film-forming conditions are difficult to be readily changed as desired.

The occurrence of such problems as above described is not limited only in the case of forming a deposited film on a web substrate. Similar problems are liable to occur also in the case where a web substrate is continuously transported to pass through a plurality of processing chambers while the web substrate being processed in each processing chamber. The processing of the web substrate in this case includes film-forming treatment by way of sputtering, vacuum evaporation or CVD other than plasma CVD, etching, thermal annealing and the like. The foregoing problems are more likely to occur particularly in the case where the gas composition and/or the inner pressure in one of the processing space are different from those in the adjacent processing spaces.

SUMMARY OF THE INVENTION

An principal object of the present invention is to eliminate the foregoing problems in the prior art and to provide an improved substrate-processing method and apparatus which enables to readily optimize the flow of processing gas in the processing space whereby making it possible to stably and continuously form a highly reliable deposited film having stable and uniform characteristics which are not deteriorated over a long period of time at a reasonable production cost. This situation enables to efficiently mass-produce a photovoltaic element (or a solar cell) excelling in characteristics at a reasonable production cost.

Another object of, the present invention is to provide a substrate-processing method comprising transporting a substrate to pass through a plurality of processing spaces communicated with each other while processing said substrate in each processing space, characterized in that based on an pressure of (a) one of said plurality of processing spaces, said inner pressure of said processing space (a) and an inner pressure of (b) at least one of the processing spaces arranged before or after said processing space (a) are controlled.

A further object of the present invention is to provide a substrate processing apparatus comprising a plurality of processing-spaces, a substrate transportation means for transporting a substrate to pass through said plurality of processing spaces while processing said substrate in each processing space, and a pressure gage of measuring an inner pressure of (a) one of said plurality of processing spaces, characterized in that said substrate-processing apparatus has a control unit for controlling the inner pressure of said processing space (a) and that of (b) at least one of the processing spaces arranged before or after said processing space (a) based on information obtained from said pressure gage.

DESCRIPTION OF THE INVENTION AND PREFERRED EMBODIMENTS

Figure 1:
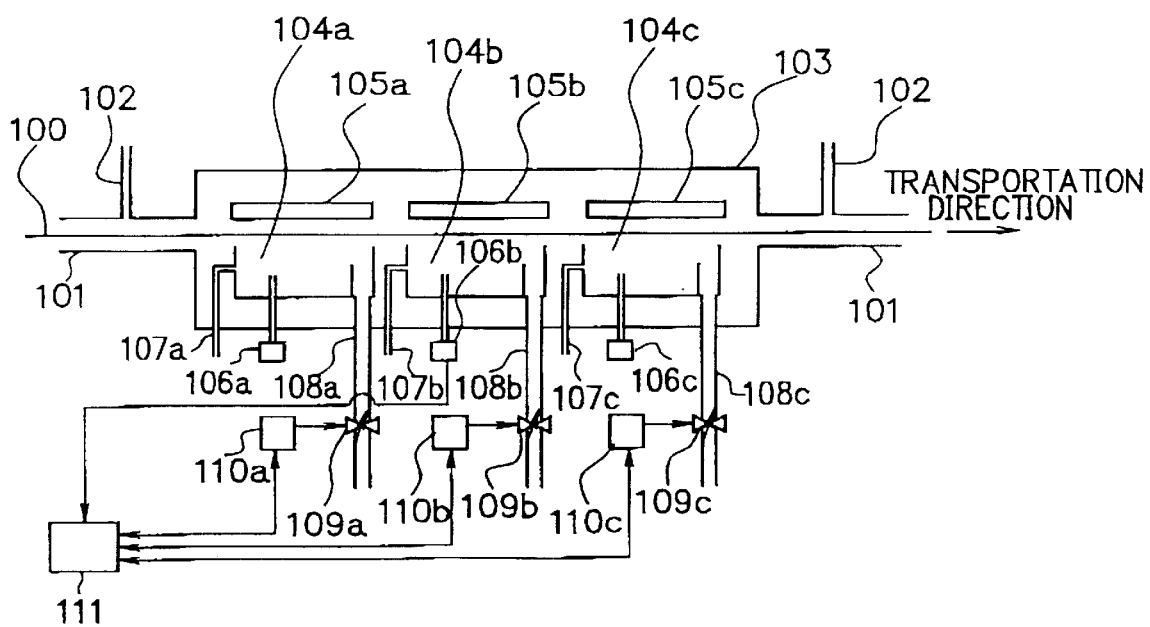
FIG. 1 is a schematic diagram illustrating the constitution of an example of a substrate-processing apparatus according to the present invention.

The present invention eliminates the foregoing problems found in the prior art and attain the above described objects.

As previously described, a first aspect of the present invention Is to provide a substrate-processing method comprising transporting a substrate to pass through a plurality of processing spaces communicated with each other while processing said substrate in each processing space, characterized in that based on an inner pressure of (a) one of said plurality of processing spaces, said inner pressure of said processing space (a) and an inner pressure of (b) at least one of the processing spaces arranged before or after said processing space (a) are controlled.

A second aspect of the present invention is to provide a substrate-processing apparatus comprising a plurality of processing spaces, a substrate transportation means for transporting a substrate to pass through said plurality of processing spaces while processing said substrate in each processing space, and a pressure gage of measuring an inner pressure of (a) one of said plurality of processing spaces, characterized in that said substrate-processing apparatus has a control unit for controlling the inner pressure of said processing space (a) and that of (b) at least one of the processing spaces arranged before or after said processing space (a) based on information obtained from said pressure gage.

In the substrate-processing method of the present invention, the control of the inner pressure of the processing space (a) and that of the processing space (b) may be conducted by controlling a pumping speed of exhausting each of these processing spaces. The pumping speed of each of the processing spaces may be controlled by regulating an opening extent of an exhaust valve provided at an exhaust pipe connected to each processing space or by regulating the opening extent of each of the exhaust valves by way of interlocking the exhaust valves so that their opening extent extents become a prescribed ratio.

In the substrate-processing method of the present invention, it is possible that the processing space (a) and the processing space (b) are arranged in a common processing chamber or they are communicated with each other through a gas gate.

In the substrate-processing method of the present invention, the processing of the substrate can include film-forming treatment by way of sputtering, vacuum evaporation or CVD (including plasma CVD), etching treatment, and thermal annealing treatment.

The substrate may comprises a web substrate. However, this is not limitative. The substrate-processing method of the present invention is applicable in processing other substrates such as a cylindrical substrate, a square substrate and the like.

In the substrate-processing apparatus of the present invention, it is preferred that each of said plurality of processing spaces is provided with an exhaust pipe having a variable valve and which is connected to an exhaust system provided with a vacuum pump, and said control unit serves to directly or indirectly control the opening extent of each variable valve.

In the substrate-processing apparatus of the present invention, it is preferred that a pressure controller is connected to each variable valve said pressure controller being capable of serving to regulate the opening extent of said variable valve, and the opening extent of each variable valve Is regulated by the pressure controller connected thereto based on a signal transmitted from said control unit.

In the substrate-processing apparatus of the present invention, it is possible that the processing space (a) and the processing space (b) are arranged in a common processing chamber or they are communicated with each other through a gas gate.

In the substrate-processing apparatus of the present invention, it is possible that at least one of the processing spaces is provided with a film-forming means. The film-forming means in this case may comprise a combination of a processing gas supply means and a power supply means, sputtering means or CVD means (including plasma CVD means) The substrate-processing apparatus of the present invention may be a film-forming apparatus such as a CVD apparatus (including a plasma CVD apparatus), a sputtering apparatus, or a vacuum evaporation apparatus, an etching apparatus or a thermal annealing apparatus.

The substrate which is processed in the substrate-processing apparatus of the present invention may comprises a web substrate. However, this is not limitative. The substrate-processing apparatus of the present invention is applicable in processing other substrates such as a cylindrical substrate, a square substrate and the like.

The present invention provides a pronounced effect particularly in the case where for at least a pair of the processing spaces with respect to the adjacent processing spaces, their internal gas compositions or/and their inner pressures differ from each other.

According to the present invention, it is possible to minimize the foregoing problems with respect to the inner pressure of the processing space (the film-forming space) in the prior art due to the factors: (i) a variation in the error range for the zero point or linearity of the pressure gage, (ii) a variation in the error range for the set pressure value of the pressure controller or in said set pressure value, (iii) a variation in the set pressure value due to an output drift or a temperature change of the pressure gage itself during the processing of the substrate over a long period of time, and the like. Because of this, the conditions upon processing the substrate can be stabilized as desired. Therefore, particularly in the case of a quantity production type apparatus which is continuously operated over a long period of time, it is possible to continuously and efficiently process-a substrate in a desirable state and mass-produce a processed substrate product having stable and uniform characteristics The substrate-processing method and the substrate-processing apparatus of the present invention will be described in more detail with reference to the drawings by using a web substrate as the substrate to be processed. However, it should be noted that the present invention is not restricted to only the case of processing a web substrate but the present invention is applicable also in the case of processing other substrates such as a cylindrical substrate, a square substrate and the like.

FIG. 1 is a schematic diagram illustrating an example of a substrate-processing apparatus according to the present invention.

The apparatus shown in FIG. 1 comprises a processing chamber 103 in which three processing spaces 104a–104c are arranged. As shown in FIG. 1, the processing space 104a is provided with an exhaust pipe 108a which is provided with a variable valve 109a and is connected to an exhaust means comprising a vacuum pump (not shown), the processing space 104b is provided with an exhaust pipe 108b which is provided with a variable valve 109b and is connected to an exhaust means comprising a vacuum pump (not shown), and the processing space 104c is provided with an exhaust pipe 108c which is provided with a variable valve 109c and is connected to an exhaust means comprising a vacuum pump (not shown). Each of reference numerals 106a to 106c indicates a pressure gage which is connected to each of the processing spaces 104a to 104c. Each of reference numerals 107a to 107c indicates a processing gas feed pipe which is connected to each of the processing spaces 104a to 104c.

Each of reference numerals 110a to 110c indicates a pressure controller. The pressure controller 110a is electrically connected to the variable valve 109a, the pressure controller 110b is electrically connected to the variable valve 109b, and the pressure controller 104c is electrically connected to the variable valve 109c. Reference numeral 111 indicates a control unit which is electrically connected to each of the pressure controllers 110a to 10c. The control unit 111 is also electrically connected to the pressure gage 106b.

Reference numeral 100 indicates a web substrate which is transported from the left side toward the right side in the figure to pass through the processing spaces 104a–104c while the web substrate is processed as desired in each processing space. Reference numeral 101 indicates a gas gate, reference numeral 102 a separation gas introduction pipe, and each of reference numerals 105a to 105c a heater for heating the web substrate 100.

Now, in the apparatus shown In FIG. 1, the pressure controller (110a, 110b, 110c) has a function to control the opening extent of the variable valve (109a, 109b, 109c) on the basis of a pressure signal transmitted from the pressure gage (106a, 106b, 106c) and another function to control the opening extent of the variable valve (109a, 109b, 109c) on the basis of an opening extent signal transmitted from the control unit 111. These two functions of the pressure controller (110a, 110b, 110c) maybe switched according to a signal transmitted from the control unit 111. The control unit 111 has a function to output a pressure-related signal transmitted from any of the pressure gages 106a–106c (the pressure gage 106b in the embodiment of FIG. 1) into any of the pressure controllers 110a–110c (the pressure controller 110b in the embodiment of FIG. 1) and another function to receive a concurrent opening extent value of any of the variable valves 109a–109c (the variable valve, 109b in the embodiment of FIG. 1) through the corresponding pressure-controller (the pressure controller 110b in the embodiment of FIG. 1) and output it into other pressure controllers (the pressure controllers 110a and 110c in the embodiment of FIG. 1). The control unit 111 has a further function to add a calculation (which will be described later) to said opening extent signal and output the result into the pressure controllers 110a–110c.

Now, as an example, description will be made of the case where the system is designed so that the processing of the substrate in the respective processing spaces is performed under the same conditions (with respect to the flow rate and composition of processing gas used, the inner pressure in the processing space, the substrate temperature, the form and size of the processing space, and the form and size of the exhaust pipe from the processing space to the variable valve) to form, for instance, the deposited film on the web substrate 100 in the respective processing spaces. In this case, the opening extent signal from the pressure controller 110b is received by the control unit 111 and is outputted as it is into the pressure controllers 110a and 110c by the control unit 111. And the variable valves 109a–109c are concurrently operated at the same opening extent, where the pumping speeds of the processing gases exhausted from the respective processing spaces can be made to be the same. By this, the substantially same processing conditions can be attained in all the processing spaces. In addition, because all the variable valves are of the same opening extent, there is no occasion of entailing such problems as found in the prior art in that the opening extents of the variable valves are differed from each other and the pumping speeds of the exhaust gases are not balanced but varied, and the processing conditions once set can be always maintained. Further, because on the basis of the measured pressure value at one position and one set pressure value, the plurality of variable valves are together operated and regulated, there is substantially no such occasion that negative influences due to a variation in the pressure values measured by the pressure gages or in the set pressure values are imparted, and very stable control can be readily performed for the inner pressures of all the processing spaces.

For instance, in the case where the processing of the substrate in the processing spaces 104a–104c is performed under condition of making the flow rate of the processing gas in each of the processing spaces 104a and 104c to be 2 times that in the processing space 104b, the control unit 111 receives an opening extent signal of the variable valve 109b which is controlled by the pressure controller 110b where an opening extent for the variable valve capable of attaining a double pumping speed is calculated in the control unit 111 and a signal of the calculated opening extent is outputted from the control unit 111 into the pressure controllers 110a and 110c. The calculation manner of the opening extent can include (i) a calculation manner of determining an adequate opening extent of the variable valve involved by way of simulation in accordance with mathematical calculation based on the form and size of the apparatus and (ii) a calculation manner of determining an adequate opening extent of the variable valve involved by previously performing related measurement using the apparatus used and obtaining the relation expression with respect to an opening extent and a pumping speed of the variable valve involved.

In accordance with such control manner as above described, it is possible to form an adequate flow pathway of the processing gas that the processing gas which is introduced into the processing space (104a, 104b, 104c) through the gas feed pipe (107a, 107b, 107c) is effectively exhausted through the exhaust pipe (108a, 108b, 108c).

In the present invention, in the case where the control unit 111 itself also functions to directly control the opening extent of the variable valve (109a, 109b, 109c) on the basis of a pressure signal form the pressure gage (106a, 106b, 106c) thereby to control the inner pressure of the processing space (104a, 104b, 104c), the pressure controller (110a, 110b, 110c) is not necessary to be used.

In the following, description will be made of an embodiment in which the foregoing constitution of the present invention is adopted in a fabrication apparatus for continuously forming a deposited film to obtain a semiconductor element, with reference to the drawings. As such fabrication apparatus for continuously forming a deposited film to obtain a semiconductor element, there can be mentioned a roll-to-roll type fabrication apparatus. In this roll-to-roll type fabrication apparatus, a web substrate is transported in the longitudinal direction to pass through a plurality of film-forming chambers communicated with each other while forming a desired deposited film on the web substrate in each film-forming chamber to form a semiconductor element on the web substrate. The film-forming method adopted in this roll-to-roll type fabrication apparatus includes plasma CVD and sputtering.

As the semiconductor element formed by the roll-to-roll type fabrication apparatus, there can be mentioned various semiconductor integrated circuits, various semiconductor sensors, and various photovoltaic elements including solar cells.

The substrate-processing method and the substrate-processing apparatus according to the present invention are particularly suitable for the production of a large area photovoltaic element (solar cell) having a large light receiving area.

Figure 8:
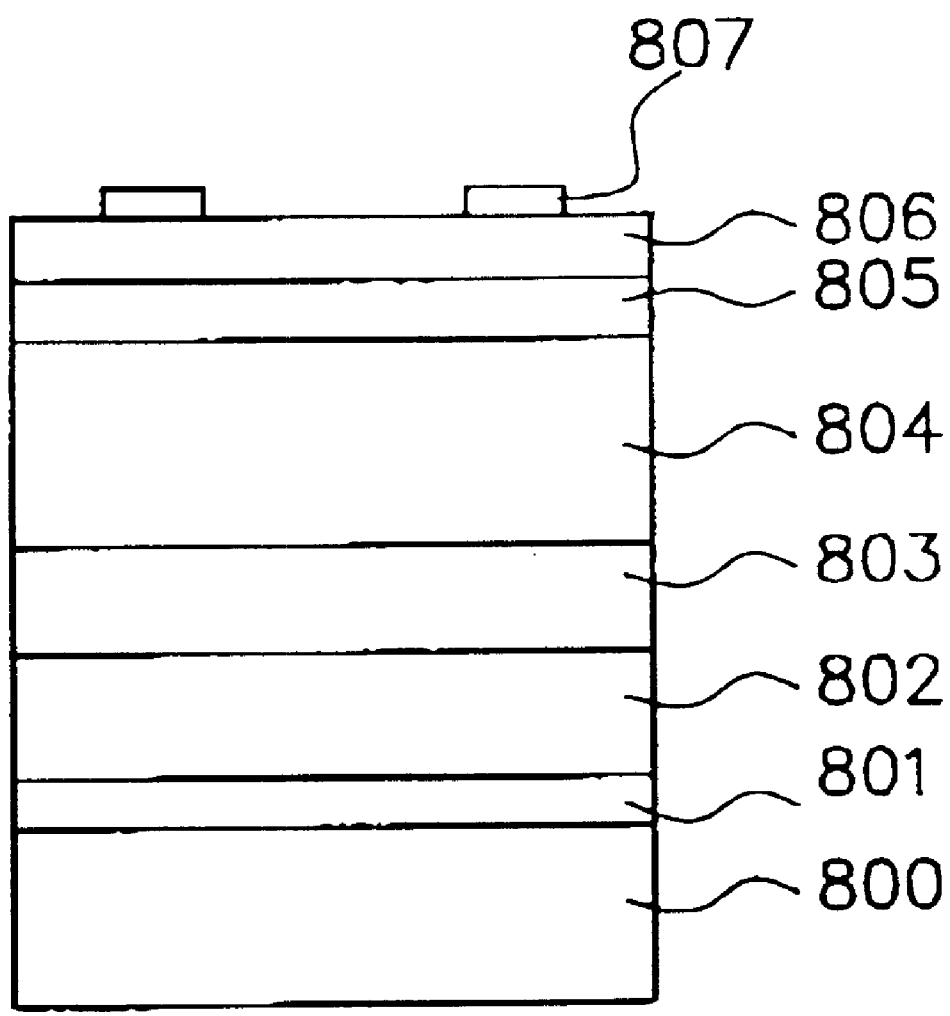
FIG. 8 is a schematic cross-sectional view illustrating the structure of an example of an photovoltaic element produced in the present invention.

FIG. 8 is a schematic cross-sectional view illustrating the structure of an example of such photovoltaic element. The photovoltaic element shown in FIG. 8 comprises a back reflecting layer 801, a lower transparent electrically conductive layer 802, a semiconductor photoactive layer [comprising an n-type semiconductor layer 803, an i-type semiconductor layer 804 and a p-type semiconductor layer 805], and an upper transparent electrically conductive layer 806 stacked in this order on a substrate 800. Reference numeral 807 indicates a collecting electrode formed on the upper transparent electrically conductive layer 806.

Description will be made of the roll-to-roll type fabrication apparatus capable of forming such semiconductor element with reference to FIG. 5.

Figure 5:
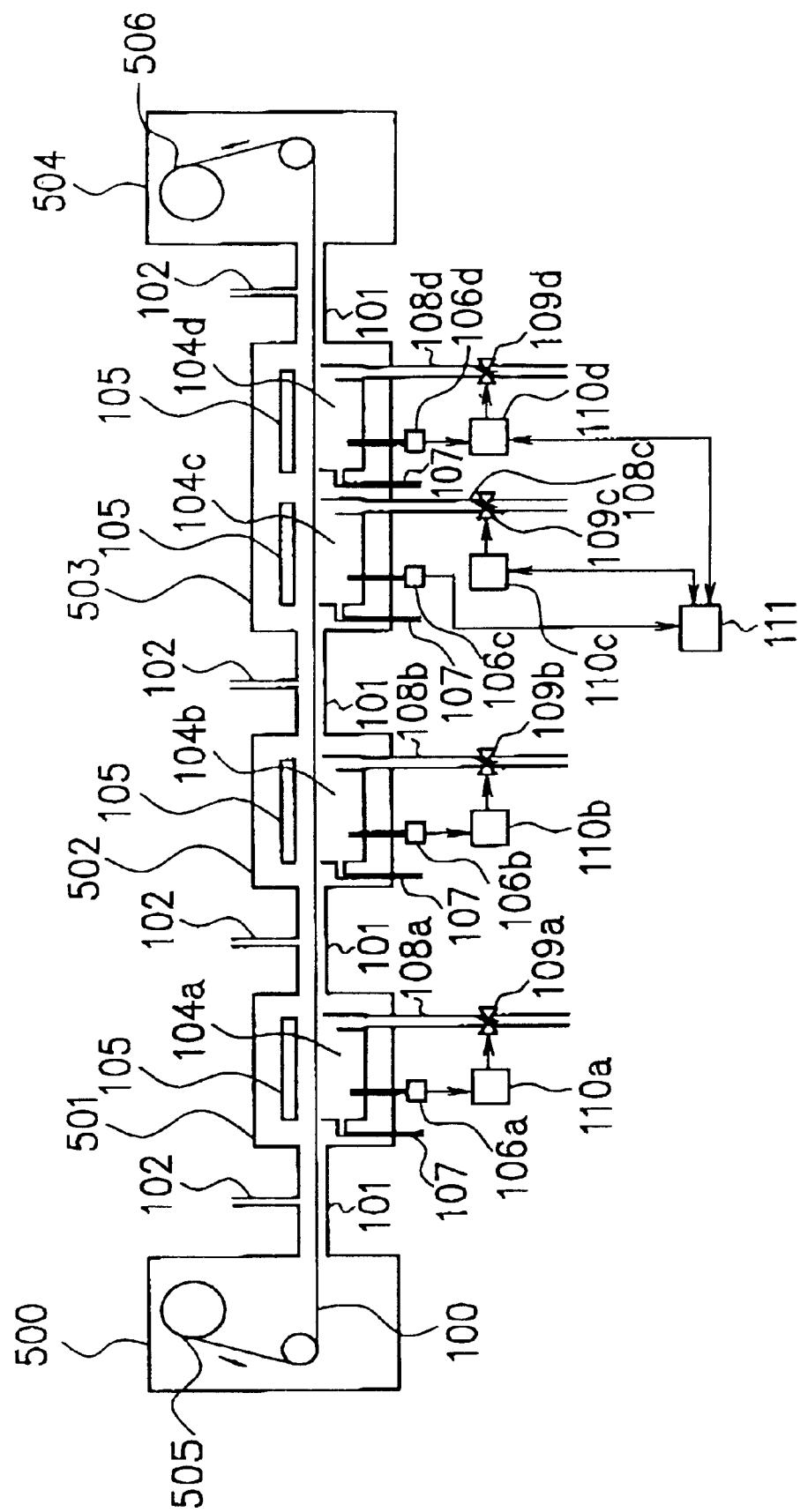
FIG. 5 is a schematic diagram illustrating the constitution of an example of a roll-to-roll type film-forming apparatus according to the present invention.

FIG. 5 is a schematic diagram illustrating the constitution of an example of a roll-to-roll type plasma CVD fabrication apparatus. The apparatus shown in FIG. 5 comprises a substrate delivery chamber 500 for delivering a web substrate 100, a processing chamber 501 for forming an n-type semiconductor layer by means of plasma CVD, a processing chamber 502 for forming an i-type semiconductor layer by means of plasma CVD, a processing chamber 503 for forming a p-type semiconductor layer by means of plasma CVD, and a substrate take-up chamber 504 for taking up the web substrate. The chambers 500 to 504 are communicated with each other through a gas gate 101 provided with a separation gas introduction pipe 102.

The web substrate 100 is paid out from a pay-out bobbin 505 having the web substrate wound thereon which is provided in the substrate delivery chamber 500 and it is delivered through a steering roll followed by being transported to sequentially pass through the processing chambers 501–503 and enter in the substrate take-up chamber 504 where it is taken up by and wound on a take-up bobbin 506 provided in the substrate take-up chamber 504. During he web substrate is transported from the substrate delivery chamber 500 toward the substrate take-up chamber 504 in this way, there are formed an n-type semiconductor layer thereon by means of a processing spaces 104a (a film-forming space) provided in the processing chamber 501 an i-type semiconductor layer thereon by means of a processing spaces 104b (a film-forming space) provided in the processing chamber 502, and a p-type semiconductor layer thereon by means of processing spaces 104c and 104d (film-forming spaces) provided in the processing chamber 503 whereby a photovoltaic element with a pin junction structure is formed on the web substrate.

Each of the processing spaces 104a to 104d (the film-forming spaces) is comprised of a vessel member opened upward and the web substrate 100 which is situated to cover the top open face of the vessel member.

In each of the processing chambers 501 and 502, there are arranged a lamp heater unit (not shown) for provisionally heating the web substrate 100 from above and a heater 105 for heating the web substrate 100 from above. Similarly, in the processing chamber 503, there are arranged a pair of a lamp heater unit (not shown) and a heater 105 for the processing space 104c (the film-forming space) and a pair of a lamp heater unit (not shown) and a heater 165 for the processing space 104d (the film-forming space).

The processing space 104a provided in the processing chamber 501 is provided with a gas feed pipe 107 for introducing processing gas (or film-forming raw material gas) supplied from a gas supply system (not shown) into the processing space 104a; an exhaust pipe 108a for exhausting (evacuating) the processing space 104a, the exhaust pipe 108a being connected to an exhaust means comprising a vacuum pump (not shown) and being provided with a variable valve 109a for controlling the inner pressure of the processing space 104a; a high frequency electrode (not shown) for supplying a power to impart an energy to the processing gas introduced into the processing space 104a whereby generating plasma discharge in the processing space 104a; a pressure gage 106a for measuring the inner pressure of the processing space 104a; a pressure controller 110a which is electrically connected to the pressure gage 106a and also to the variable valve 109a; and a wall-heater (not shown) for heating the member constituting the processing space 104a.

The processing space 104b provided in the processing chamber 502 is provided with a gas feed pipe 107 for introducing processing gas (or film-forming raw material gas) supplied from a gas supply system (not shown) into the processing space 104b; an exhaust pipe 108b for exhausting (evacuating) the processing space 104b, the exhaust pipe 108b being connected to an exhaust means comprising a vacuum pump (not shown) and being provided with a variable valve 109b for controlling the inner pressure of the processing space 104b; a high frequency electrode (not shown) for supplying a power to impart an energy to the processing gas introduced into the processing space 104b whereby generating plasma discharge In the processing space 104b; a pressure gage 106b for measuring the inner pressure of the processing space 104b; a pressure controller 110b which is electrically connected to the pressure gage 106b and also to the variable valve 109b; and a wall-heater (not shown) for heating the member constituting the processing space 104b. Each of the processing spaces 104c and 104d provided in the processing chamber 503 is provided with a gas feed pipe 107 for introducing processing gas (or film-forming raw material gas) supplied from a gas supply system (not shown) into the processing space 104c or 104d; a high frequency electrode (not shown) for supplying a power to impart an energy to the processing gas Introduced into the processing space 104c or 104d whereby generating plasma discharge in the processing space 104c or 104d; and a wall-heater (not shown) for heating the member constituting the processing space 104c or 104d.

The processing space 104c is also provided with an exhaust pipe 108c for exhausting (evacuating) the processing space 104c, the exhaust pipe 108c being connected to an exhaust means comprising a vacuum pump (not shown) and being provided with a variable valve 109c for controlling the inner pressure of the processing space 104c; a pressure gage 106c for measuring the inner pressure of the processing space 104c; a pressure controller 110c and a control unit 111, the pressure controller 110c being electrically connected to the variable valve 109c, and the control unit being electrically connected to the pressure gage 106c and also to the pressure controller 110c. The control unit is further electrically connected to a pressure controller 110d which is provided at the processing space 104d, description of which will be made below.

That is, the processing space 104d is also provided with an exhaust pipe 108d for exhausting (evacuating) the processing space 104d, the exhaust pipe 108d being connected to an exhaust means comprising a vacuum pump (not shown) and being provided with a variable valve 109d for controlling the inner pressure of the processing space 104d; a pressure gage 106d for measuring the inner pressure of the-processing space 104d; and a pressure controller 110d which is electrically connected to the variable valve 109d and also the above-described control unit 111.

As above described, in the fabrication apparatus shown in FIG. 5, the web substrate 100 wound on the pay-out bobbin 505 provided in the substrate delivery chamber 500 is delivered and it is transported to sequentially pass through the processing spaces 104a to 104d (the film-forming spaces) and enter in the substrate take-up chamber 504 where it is taken up by and wound on the take-up bobbin 506 provided in the substrate take-up chamber 504. In this case, it is important that the web substrate is transported so as to pass through the processing spaces at a prescribed transportation speed without suffering from knocking, torsion or warping. In the case where the web substrate 100 is magnetic, by supporting the web substrate losing a rotary magnet roller comprising a magnetic body (not shown), it is possible to transport the web substrate along a desired route while m-maintaining it in a prescribed form The transportation speed of the web substrate should be determined depending on forming conditions employed. However, in general, it Is In a range of 200 mm/minute to 5000 mm/minute.

By continuously providing a plurality of film-forming chambers such a manner as shown in FIG 5 and continuously forming a deposited film comprising a different material in each of the film-forming chambers, it is possible form a stacked layer comprising a plurality of deposited films each comprising a different material being stacked. In this case, it is preferred that a gas gate 101 (see, FIG. 5) is provided between each adjacent film-forming chambers in order to prevent each film-forming chamber from being influence by the other film-forming chamber situated next thereto.

In any case, the gas gates 101 are provided for the purpose of separating and isolating all the chambers [the substrate delivery chamber, the substrate take-up chamber and the film-forming chambers (the processing chambers)] one from the other so that the gases in each adjacent chambers are not mutually mixed. The gas gates are necessary to be provided such that they allow the web substrate to smoothly pass therethrough. The gas gate is structured to have a space in a slit-like form which allows the web substrate to pass through while maintaining a prescribed clearance between the inner wall face of the slit-like space and the film-forming face of the web substrate. This clearance is preferred to be of a width, for instance, in a range of 1 mm to 5 mm for the purposes of diminishing the conductance and preventing mutual diffusion and contamination of the gases in the respective film-forming chambers. Further, the gas gate 101 is structured such that separation gas is introduced thereinto through the separation gas introduction pipe 102 to push and return the processing gas which will invade into the gas gate from the film-forming chamber (the processing chamber).

As the separation gas introduced into the gas gate, there can be mentioned rare gases such as Ar gas, He gas, Ne gas, Kr gas, Xe gas and Rn gas. Besides, dilution gases such as H$_2$ gas and the like which are used in the preparation of a semiconductor are also usable.

For the flow rate of the separation gas, it is determined depending on the related factors such as conductance of the entire gas gate. For instance, when a point where the gas pressure is maximized is provided at a central portion of the gas gate, the separation gas flows in opposite film-forming chamber sides from the central portion, where mutual diffusion of the processing gases in the adjacent film-forming chambers situated through the gas gate is prevented at a negligible level.

The web substrate used as the substrate in the present invention is desired to comprises a web member which is slightly deformed or distorted, has a desired physical strength and is electrically conductive. Specific examples of such member are metallic thin plates made of a metallic material selected from stainless steel, aluminum, aluminum alloy, iron, iron alloy, copper, and copper alloy and composite members comprising these metallic thin plates. Besides, heat-resistant synthetic resin sheets made of one or more resins selected from polyimide, polyimide, polyethylene terephthatate and epoxy resin which are applied with conductive treatment using a metal, alloy or transparent conductive oxide (TCO) by way of sputtering, vacuum evaporation, plating or spraying are also usable.

For the thickness of the web substrate used as the substrate in the present invention, it is desired to be as thinner as possible in view of the cost and the accommodation space within a range where a physical strength capable of maintaining a prescribed route or form which is established upon the transportation is exhibited. However, in general, thickness of the web substrate is desired to be preferably in a range of 0.01 mm to 1 mm or most preferably in a range of 0.05 mm to 0.5 mm.

In the case where a thin plate made of a metal or the like is used as the substrate, even when the thickness thereof is relatively thinned, there can be attained a desirable physical strength for the thinned plate.

There is no particular limitation for the width of the web substrate. The width of the web substrate should be determined depending on the related factors such as film-forming means adopted, the size of a reaction vessel used, and the like. There is also no particular limitation for the length of the web substrate. The web substrate may have a length which can be wound in a roll form. The web substrate may be a prolonged substrate comprising two or more long substrates connected by means of welding or the like.

In the present inventions it is possible to use plate substrates other than the web substrate. When the web substrate is used as in this embodiment, it is difficult for the adjacent processing chambers to be absolutely isolated one from the other. However, In the case where such plate substrate is used, the adjacent processing chambers can be absolutely isolated one from the other, and because of this, the effects of the present invention become more significant.

In the following, preferred embodiments of the film-forming apparatus as the substrate-processing apparatus according to the present invention will be described with reference to FIGS. 1 and 2.

FIG. 1 is a schematic diagram illustrating a principal part of an example of a film-forming apparatus as a substrate-processing apparatus according to the present invention.

Figure 2:
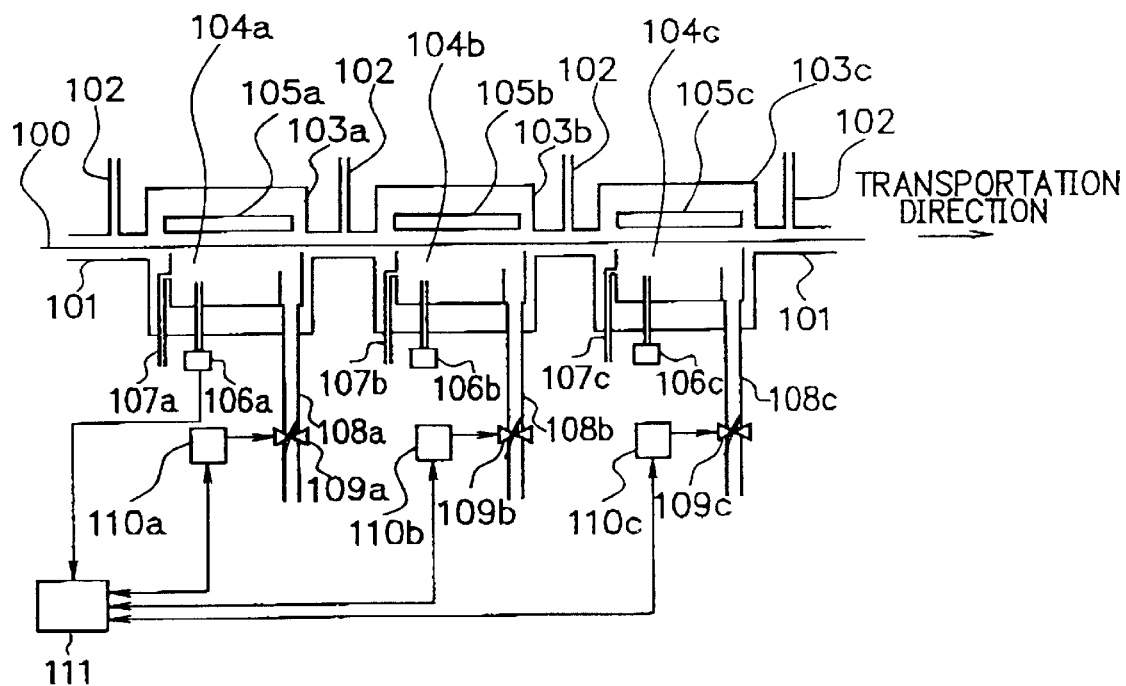
FIG. 2 is a schematic diagram illustrating the constitution of another example of a substrate-processing apparatus according to the present invention.
Figure 3:
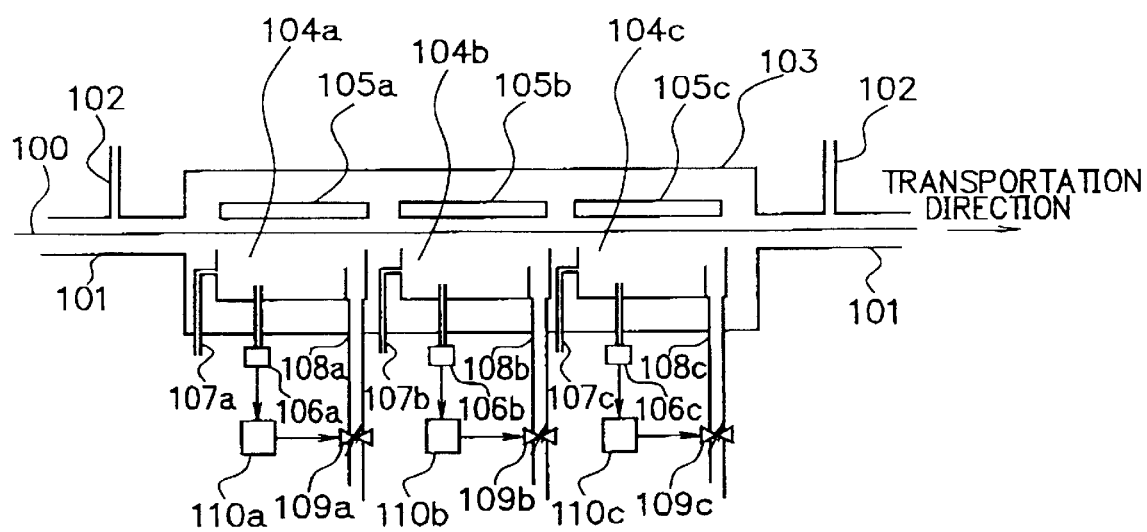
FIG. 3 is a schematic diagram illustrating the constitution of an example of a conventional substrate-processing apparatus.
Figure 4:
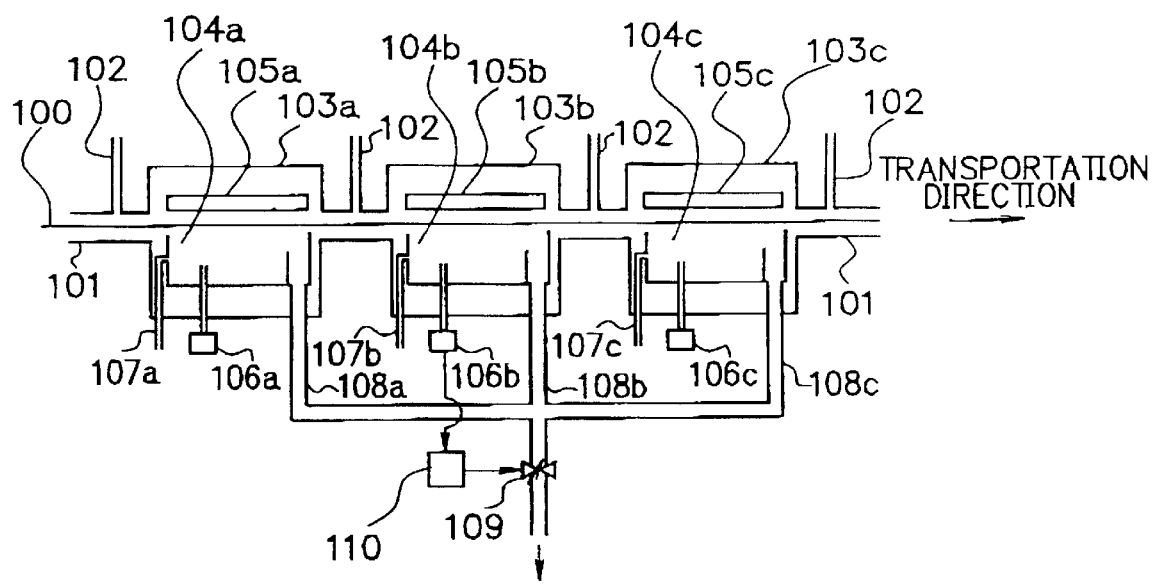
FIG. 4 is a schematic diagram illustrating the constitution of another example of a conventional substrate-processing apparatus.

FIG. 2 is a schematic diagram Illustrating a principal part of another example of a film-forming apparatus as a substrate-processing apparatus according to the present invention.

First, description will be made of the apparatus shown in FIG. 1.

In FIG. 1, reference numeral 100 indicates a web substrate, reference numeral 101 a gas gate, reference numeral 102 a separation gas introduction pipes and reference numeral 103 a film-forming chamber as a processing chamber. Each of reference numerals 104a to 104c indicates a film-forming space as a processing space. Each of reference numerals 105a to 105c indicates a heater for heating the web substrate 100. Each of reference numerals 106a to 106c indicates a pressure gage. Each of reference numerals 107a to 107c indicates a processing gas feed pipe. Each of reference numerals 108a to 108c indicates an exhaust pipe. Each of reference numerals 109a to 109c indicates a is variable valve. Each of reference numerals 110a to 110c indicates a pressure controller. Reference numeral 111 indicates a control unit.

As previously explained with reference to FIG. 1, the film-forming apparatus shown in FIG. 1 as the substrate-processing apparatus comprises one film-forming chamber 103 in which three film-forming spaces 104a to 104c are arranged.

The film-forming space 104a is provided with an exhaust pipe 108a which is provided with a variable valve 109a and is connected to an exhaust means comprising a vacuum pump (not shown), the film-forming space 104b is provided with an exhaust pipe 108b which is provided with a variable valve 109b and is connected to an exhaust means comprising a vacuum-pump (not shown), and the film-forming space 104c is provided with an exhaust pipe 108c which is provided with a variable valve 109c and is connected to an exhaust means comprising a vacuum pump (not shown). Each of the film-forming spaces 104a to 104c is provided with a processing gas feed pipe (107a, 107b, 107c) which is connected to a gas supply system (not shown).

Pressure gages 106a to 106c are connected respectively to the film-forming spaces 104a to 104c. Pressure controller 110a is electrically connected to the variable valve 109a, pressure controller 110b is electrically connected to the variable valve 109b, and pressure controller 110c is electrically connected to the variable valve 109c. Control unit 111 is electrically connected to each of the pressure controllers 110a to 110c. The control unit 111 is also electrically connected to the pressure gage 106b.

Now, in the film-forming apparatus shown in FIG. 1, the web substrate 100 is delivered from a substrate pay-out bobbin (not shown) having the web substrate wound thereon provided in a substrate delivery chamber (not shown) and it is transported such that it first passes through the gas gate 101 to enter in the film-forming chamber 103 where it passes sequentially through the film-forming spaces 104a to 104c, then it passes through the gas gate 101 to enter in a substrate take-up chamber (not shown) where it is taken up by and wound on a substrate take-up bobbin (not shown) provided in said substrate take-up chamber. During the transportation of the web substrate in this way, a deposited film is formed on the web substrate 100 by a manner that desired processing gas is introduced into the film-forming space (104a, 104b, 104c) through the processing gas feed pipe (107a, 107b, 107c) the inner pressure of the film-forming space (104a, 104b, 104c) is controlled as will be described below, and a power from a power supply source (not shown) is supplied in each film-forming space to excite and decompose the processing gas introduced therein, whereby casing the formation of a deposited film on the web substrate by way of plasma CVD or sputtering in each film-forming space.

Particularly, the control of the inner pressure of the film-forming space (104a, 104b, 104c) upon the film formation on the web substrate is performed as will be described below.

That is, the desired processing gas is introduced into the film-forming space (104a, 104b, 104c) through the processing gas feed pipe (107a, 107b, 107c), where the film-forming space (104a, 104b, 104c) is exhausted (evacuated) through the exhaust pipe (108a, 108b, 108c) provided with the variable valve (109a, 109b, 109c) into the exhaust means (not shown). The inner pressure (the inner gas pressure) of the film-forming space (104a, 104b, 104c) is controlled as desired by way of regulating the opening extent of the variable valve (109a, 109b, 109c) by virtue of the action of the pressure controller (110a, 110b, 110c) which is actuated on the basis of an opening extent calculated by the control unit 111 on the basis of a measured pressure value by the pressure gage 106b. For instance, in the case where the film-forming spaces 104a–104c are of the same flow rate and the same composition for the processing gases used therein, it is sufficient to make the control unit 111 behave such that the opening extent of the variable valve 109b is controlled by the pressure controller 110b on the basis of a pressure signal from the pressure gage 106b and the variable valves 109a and 109c are controlled so that their opening extents are matched with the opening extent of the variable valve 109b. By this, the pumping speeds of the exhaust gases passing through the variable valves 109a–109c become to be the same. In this case, when the film-forming spaces the exhaust pipes and the exhaust means are substantially the same with respect to their forms, sizes and performances, the inner pressures of the film-forming spaces 104a–104c become substantially the same, an adequate gas flow pathway is formed for each of the film-forming spaces 104a–104c, and the processing gas used in each of the film-forming spaces is prevented from flowing into the film-forming space adjacent thereto. The term "gas flow pathway" means that the processing gas introduced into the film-forming space (104a, 104b, 104c) through the processing gas feed pipe (107a, 107b, 107c) is exhausted (evacuated) through the exhaust pipe (108a, 108b, 108c).

Description will be made of the film-forming apparatus as the substrate-processing apparatus shown in FIG. 2.

The apparatus shown in FIG. 2 is a partial modification of the apparatus shown in FIG. 1. The apparatus shown in FIG. 2 is different from the apparatus shown in FIG. 1 for the point that each of the film-forming spaces 104a–104c is arranged in a separate film-forming chamber (103a, 103b, 103c).

In the apparatus shown in FIG. 2, a first gas gate 101 provided with a separation gas introduction pipe 102 is provided between a substrate delivery chamber (not shown) in which a substrate pay-out bobbin having the web substrate 100 wound thereon (not shown) is provided and the film-forming chamber 103a in which the film-forming space 104a is arranged; a second gas gate 101 provided with a separation gas introduction pipe 102 is provided between the film-forming chamber 103a and the film-forming chamber 103b in which the film-forming space 104b is arranged; a third gas gate 101 provided with a separation gas introduction pipe 102 is provided between the film-forming chamber 103b and the film-forming chamber 103c in which the film-forming space 104c is arranged, and a fourth gas gate 101 provided with a separation gas introduction pipe 102 is provided between the film-forming chamber 103c and a substrate take-up chamber (not shown) in which a substrate take-up bobbin (not shown) on which the web substrate 100 transported from the film-forming chamber 103c is taken up and wound is provided.

In the film-forming apparatus shown in FIG. 2, as well as in the case of the film-forming apparatus shown in FIG. 1, by regulating the opening extent extents of the variable valves 109a–109c as desired using the control unit 111, an adequate gas flow pathway can be attained for each of the film-forming spaces 104a–104c.

The formation of a deposited film on the web substrate in the film-forming apparatus shown in FIG. 2 is performed in the same manner as in the film-forming apparatus shown in FIG. 1. Specifically, during the transportation of the web substrate 100 from the substrate delivery chamber toward the substrate take-up chamber, a deposited film is formed on the web substrate 100 by a manner that desired processing gas is introduced into each of the film-forming spaces 104a–104c through each of the processing gas feed pipes 107a–107c, the inner pressures in the film-forming spaces 104a–104c are controlled in the same manner as in the case of the film-forming apparatus shown in FIG. 1, and a power from a power supply source (not shown) is supplied in each film-forming space to excite and decompose the processing gas introduced therein, whereby casing the formation of a deposited film on the web substrate by way of plasma CVD or sputtering in each film-forming space. The exhaust gases after the film formation in the film-forming spaces are exhausted through the exhaust pipes provided with the variable valves into the exhaust means (not shown).

In each of the film-forming apparatus shown in FIGS. 1 and 2, the web substrate 100 having a plurality of deposited films stacked thereon is finally transported into the substrate take-up chamber, where the web substrate is usually wound on the substrate take-up bobbin together with an interleaf for protecting the film-bearing face of he web substrate. As the interleaf used, there can be mentioned tapes made of a heat resistant resin such as polyimide or fluorescing such as Teflon or glass wool.

As previously described, in the case of continuously forming a deposited film on a long substrate in order to produce a large area thin film semiconductor element such as a large area photovoltaic element (or a large area solar cell), by using the film-forming apparatus according to the present invention, it is possible to stably and continuously form a high quality deposited film on a long substrate while solving the problems in the prior art and satisfying the requirements in the continuous film formation. Thus, according to the present invention, a high quality photovoltaic element (solar cell) having a large area and having uniform characteristics can be mass-produced.

In the following, the present invention will be described in more detail with reference examples. It should be understood that these examples are only for the illustrative purposes and not intended to restrict the scope of the present invention.

EXAMPLE 1

In this example, a photovoltaic element having a pin junction structure-was continuously formed on a web substrate using the roll-to-roll type plasma CVD apparatus shown in FIG. 5 as will be described below.

First, there was provided a substrate roll comprising a web substrate made of stainless steel SUS 430 of 0.2 mm in thickness, 350 mm in width and 300 m in length having a two-layered back reflecting layer comprising a 0.1 $\mu$m thick aluminum film and a 1.0.$\mu$m thick zinc oxide (ZnO) film formed in this order thereon by means of a conventional roll-to-roll type film-forming apparatus by way of sputtering (not shown) which is wound in a roll form.

The substrate roll was set on the pay-out bobbin 505 in the substrate delivery chamber 500 of the apparatus shown in FIG. 5. From the pay-out bobbin 505, the web substrate as the web substrate 100 was paid out and delivered from the substrate delivery chamber 500, followed by passing through the gas gate 101, the processing chamber 501, the gas gate 101, the processing chamber 502, the gas gate 101, the processing chamber 503 and the gas gate 101 to enter in the substrate take-up chamber 504, where the beginning portion of the web substrate was fixed to and wound on the substrate take-up bobbin 506. And the transportation system of the web substrate was adjusted so that the web substrate could be continuously and smoothly transported from the substrate delivery chamber to the substrate take-up chamber without being distorted or warped.

Then, the processing spaces 104a–104d evacuated until their inner pressures reached about 1 Torr through the exhaust pipes 108a–108d provided with the variable valves 109a–109d by actuating the exhaust means (not shown). While continuing this evacuation, He gas was flown into each of the processing spaces 104a–104d at a flow rate of 100 sccm through the processing gas feed pipe 107, and by measuring the inner pressure of each of the processing spaces 104a–104d by each of the pressure gases 106a–106d and regulating the opening extent of each of the variable valves 109a–109d based on the reading on each of the pressure gases 106a–106d, the inner pressure of each of the processing spaces 104a–104d is maintained at 1.0 Torr. Then, the heaters 105 were actuated to heat the inside atmosphere of each of the processing spaces 104a–104d such that the temperature of the web substrate became 300° C., where this heating was maintained for 5 hours whereby the inside of each of the processing spaces 104a–104d was subjected to baking treatment to release and remove impurity gas components present therein.

After this, the introduction of the He gas into each of the processing spaces 104a–104d was terminated. Then, a gas mixture for the formation of an n-type layer shown in Table 1 was introduced into the processing space 104a through the gas feed pipe 107 extending from a gas supply system (not shown); a gas mixture for the formation of an i-type layer shown in Table 1 was introduced into the processing space 104b through the gas feed pipe 107 extending from a gas supply system (not shown): a gas mixture for the formation of a p-type layer shown in Table 1 was introduced into the processing space 104c through the gas feed pipe 107 extending from a gas supply system (not shown); and a gas mixture for the formation of a p-type layer shown in Table 1 was introduced into the processing space 104d through the gas feed pipe 107 extending from a gas supply system (not shown). And $H_2$ gas was flown into the respective gas gates 101 through the respective separation gas introduction pipes 102 at a flow rate of 1000 scam. Successively, the web substrate 100 started moving at a transportation speed of 1000 mm/minute. And an RF power of 400 W from an RF power source (not shown) was supplied into the processing space 104a through a high frequency electrode (not shown) provided therein under condition of maintaining the web substrate at 300° C. in the processing space 104a; an RF power of 200 W from an RF power source (not shown) was supplied into the processing space 104b through a high frequency electrode (not shown) provided therein under condition of maintaining the web substrate at 350° C. in the processing space 104b; an RF power of 1000 W from an RF power source (not shown) was supplied into the processing space 104c through a high frequency electrode (not shown) provided therein under condition of maintaining the web substrate at 300° C. in the processing space 104c; and an RE power of 1000 W from an RF power source (not shown) was supplied into the processing space 104d through a high frequency electrode (not shown) provided therein under condition of maintaining the web substrate at 300° C. in the processing space 104d. By this, on the web substrate 100, there were continuously formed a 20 nm thick n-type semiconductor film as an n-type layer in the processing space 104a, a 80 nm thick i-type semiconductor film as an i-type layer in the processing space 104b, a 3 nm thick p-type semiconductor film as a p-type layer in the processing space 104c, and a 3 nm thick p-type semiconductor film as a p-type layer in the processing space 104d. Thus, a pin junction structured semiconductor layer was continuously formed on the two-layered back reflecting layer previously formed on the web substrate. The film-forming conditions in the respective processing spaces 104a–104d are collectively shown in Table 1.

In this example, the formation of the p-type layer was conducted by forming a p-type semiconductor thin film having an excellent property in the processing space 104c and another p-type semiconductor thin film having an excellent property in the processing space 104d whereby stacking these two p-type semiconductor thin films. The p-type layer of the photovoltaic element thus formed was found to have a relatively large thickness and excellent characteristics.

In the above, the control of the inner pressure of the processing spaces 104c and 104d was performed by maintaining the opening extent extents of the variable valves 109c–109d at the sauce opening extent using only a measured value by the pressure gage 106c for the processing space 104c. By this, the inner pressure of each of the processing spaces 104c and 104d during the film formation could be maintained at a desired pressure value shown in Table 1.

The film-forming process fox the web substrate was continuously performed for about 5 hours, where of the web substrate whose total length being 300 m, the pin junction structured semiconductor layer could be formed over the 250 m length.

The take-up bobbin 506 having the web substrate having the two-layered back reflecting layer and the pin junction structured semiconductor layer thereon wound thereon was taken out from the substrate take-up chamber 504.

Then, an empty substrate-take up bobbin 506 was set in the substrate take-up chamber 504. And there was provided a substrate roll comprising a web substrate made of stainless steel SUS 430 of 0.2 mm in thickness, 350 mm in width and 300 m in length having a two-layered back reflecting layer comprising a 0.1 μm thick aluminum film and a 1.0 μm thick zinc oxide (ZnO) film formed in this order thereon by means of a conventional roll-to-roll type film-forming apparatus by way of sputtering (not shown) which is wound in a roll form. This substrate roll was set on the substrate pay-out bobbin 505 in the substrate delivery chamber 500 of the apparatus shown in FIG. 5.

Then, the foregoing procedures for forming the pin junction structured semiconductor layer were repeated.

In this way, the film formation for the substrate roll (this will be hereinafter referred to as "film formation run") was conducted 10 times in the sum.

Thereafter, the insides of the processing chambers 501–503 were examined. As a result, it was found that the inner wall faces of each of the processing chambers 501–503 including the processing spaces 104a–104d were deposited with neither films nor by-products.

The substrate take-up bobbin having the web substrate having the two-layered back reflecting layer and the pin junction structured semiconductor layer thereon wound thereon taken out from the substrate take-up chamber 504 in the 10th film formation run was set in a conventional roll-to-roll type film-forming apparatus by way of sputtering (not shown), where a 800 Å thick transparent electrically conductive film comprising ITO as an upper transparent electrically conductive layer was formed on the pin junction structured semiconductor layer of the web substrate.

Then, the substrate roll obtained in the above was set in a conventional cutting apparatus (not shown), where while delivering the web substrate from the substrate roll, the web substrate was cut at an every interval of 100 mm in the transportation direction to obtain a number of element samples. For each of these element samples, an Ag-paste was screen-printed thereon. Thus, there were obtained a number of photovoltaic elements having such configuration as shown in FIG. 8.

Evaluation with respect to characteristics for the photovoltaic elements thus obtained was conducted by measuring a photoelectric conversion efficiency ($\eta$) under the irradiation of pseudo sunlight of AM 1.5 and with an energy density of 100 mW/cm$^2$ for each of the photovoltaic elements and obtaining an average value among the measured photoelectric conversion efficiencies of the photovoltaic elements.

The average value of photoelectric conversion efficiency obtained is shown in Table 2.

COMPARATIVE EXAMPLE 1

The procedures of Example 1 were repeated, except that the exhaustion of the processing space 104c and that of the processing space 104d were separately performed whereby the inner pressure of the processing space 104c and that of the processing space 104d were separately adjusted as desired. Particularly, for the processing space 104c, the opening extent of the variable valve 104c was controlled by the pressure controller 110c using a measured pressure value by the pressure gage 104c, and for the processing space 104d, the opening extent of the variable valve 104d was controlled by the pressure controller 110d using a measured pressure value by the pressure gage 104d.

As well as in the case of Example 1, in this comparative example, the film formation run was conducted 10 times in the sum and after this, the insides of the processing chambers 501–503 were examined. As a result, it was found that the inner wall faces of the processing chamber 503 and the inner wall faces of the processing spaces 104c and 104d were deposited with large amounts of by-products. Particularly it was found that significant amounts of by-products were deposited between the processing spaces 104c and 104d and also around the passage for the web substrate to have passed. A long period of time was consumed to remove the deposited by-products. In order to reuse the once used apparatus, the maintenance time was prolonged and as a result, the rate of operation was greatly reduced.

In this comparative example, the opening extent extents of the variable valves are to be matched in terms of the design but they were not matched in practice. And the ratio between the two opening extent extents in the first film formation run was 1:1 but it was gradually changed as the film formation was repeated and in the tenth film formation run, the ratio was changed to be 1:1.2. Based on this, the reason why such by-products were generated is considered such that a gas flow pathway of allowing the processing gas used in the processing space 104c to flow the inside space of the processing chamber 503 outside the processing space 104c and enter into the processing space 104d is established and because of this, active species of the processing gas produced in the processing space 104c are leaked into said inside space of the processing chamber 103.

In this comparative example, using the web substrate having the web substrate having the two-layered back reflecting layer and the pin junction structured semiconductor layer thereon obtained in the 14th film formation run, there were prepared a number of photovoltaic elements in the same manner as in Example 1.

Evaluation with respect to characteristics for the photovoltaic elements thus obtained was conducted by measuring a photoelectric conversion efficiency ($\eta$) under the irradiation of pseudo sunlight of AM 1.5 and with an energy density of 100 mW/cm$^2$ for each of the photovoltaic elements and obtaining an average value among the measured photoelectric conversion efficiencies of the photovoltaic elements.

The average value of photoelectric conversion efficiency obtained is shown in Table 2.

As Table 2 illustrates, it is understood that the photoelectric conversion efficiency of Example 1 is surpassing that of Comparative Example 1.

Separately, for the web substrates having been subjected to the film formation in Example 1 and Comparative Example 1, their film-formed faces were examined. As a result, the film-formed faces of the web substrates in Comparative Example 1 were found to have a lot of powdery materials deposited thereon. And they were found to be clouded in white color. These powdery materials are comprised of by-products generated in the processing chamber 103. It is considered that the deposited powdery materials became a cause of decreasing the light transmittance or occurring current leakage and as a result, the photoelectric conversion efficiency was decreased in Comparative Example 1. In Example 1, neither the deposition of such powder material nor such cloudiness were-observed.

EXAMPLE 2

The procedures of Example 1 were repeated, except that the flow rate (20 sccm) of the SiH$_4$ gas, the flow rate (3000 sccm) of the H$_2$ gas and the flow rate (30 sccm) of the PF$_3$/H$_2$ gas for the formation of the p-type layer in the processing space 104c in Example 1 were changed respectively to 10 sccm, 1500 sccm, and 15 sccm. The film-forming conditions in this example are shown in Table 3. In addition, in this example, the opening extent extents of the variable valves 109c and 104d were regulated so that the pumping speed of the exhaust gas passing through the variable valve 109c became to be half of that of the exhaust gas passing through the variable valve 109d by actuating the control unit 111 and using only a measured pressure value by the pressure gage 104c, the inner pressures of the processing spaces 104c and 104d were controlled as desired.

As well as in the case of Example 1, the film formation run was conducted 10 times in the sum. Using the web substrate having the two-layered back reflecting layer and the pin junction structured semiconductor layer thereon obtained in the 10th film formation run, there were prepared a number of photovoltaic elements in the same manner as in Example 1.

Evaluation with respect to characteristics for the photovoltaic elements thus obtained was conducted by measuring a photoelectric conversion efficiency (η) under the irradiation of pseudo sunlight of AM 1.5 and with an energy density of 100 mW/cm² for each of the photovoltaic elements and obtaining an average value among the measured photoelectric conversion efficiencies of the photovoltaic elements.

The average value of photoelectric conversion efficiency obtained is shown in Table 4.

COMPARATIVE EXAMPLE 2

Figure 6:
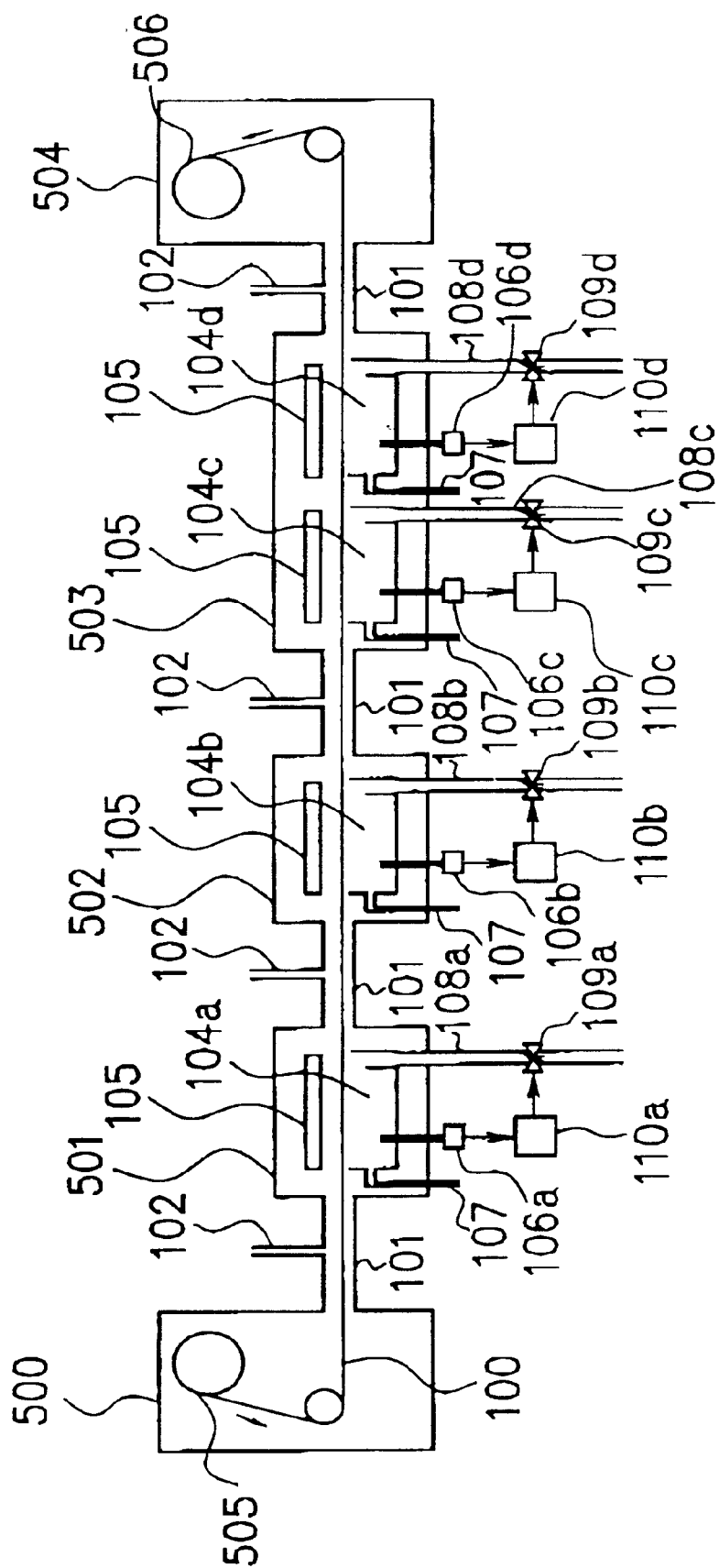
FIG. 6 is a schematic diagram illustrating the constitution of an example of a conventional roll-to-roll type film-forming apparatus.

In this comparative example, using a conventional roll-to-roll type film-forming apparatus shown in FIG. 6, as well as in the case of Comparative Example 1, the film formation for the web substrate was conducted by way of regulating the opening extent of each of variable valves 109a–109d on the basis of a measured value by each of pressure gages 106a–106d each corresponding to each of processing spaces 104a–104d in processing chambers 501–503. The film-forming conditions in this comparative example were the same as those adopted in Example 2 which are shown in Table 3.

As well as in the case of Example 2, after the film formation run was conducted 10 times in the sum, using the web substrate having the web substrate having the two-layered back reflecting layer and the pin junction structured semiconductor layer thereon obtained in the 10th film formation run, there were prepared a number of photovoltaic elements in the same manner as in Example 1.

Evaluation with respect to characteristics for the photovoltaic elements thus obtained was conducted by measuring a photoelectric conversion efficiency (n) under the irradiation of pseudo sunlight of AM 1.5 and with an energy density of 100 mW/cm² for each of the photovoltaic elements and obtaining an average value among the measured photoelectric conversion efficiencies of the photovoltaic elements.

The average value of photoelectric conversion efficiency obtained is shown in Table 4.

As Table 4 illustrates, it is understood that the photoelectric conversion efficiency of Example 2 is surpassing that of Comparative Example 2.

Separately, for the web substrates having been subjected the film formation in Example 2 and Comparative Example 2, their film-formed faces were examined. As a result, the film-formed faces of the wed substrates in Comparative Example 2 were found to have a lot of powdery materials deposited thereon. And they were found to be clouded in white color. These powdery materials are comprised of by-products generated in the processing chamber 103. It is considered that the deposited powdery materials became a cause of decreasing the light transmittance or occurring current leakage and as a result, the photoelectric conversion efficiency was decreased in Comparative Example 2. In Example 2, neither the deposition of such powder material nor such cloudiness were observed.

EXAMPLE 3

Figure 7:
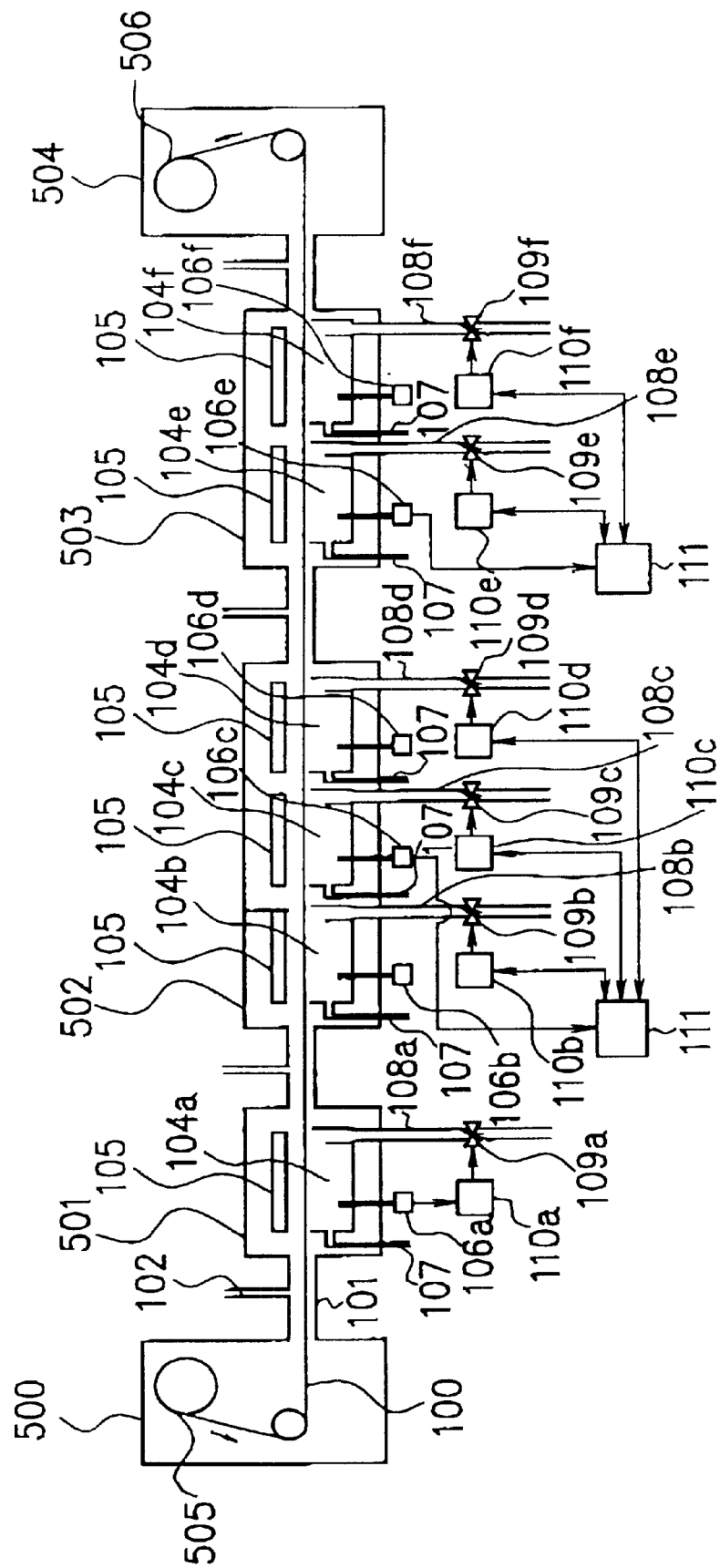
FIG. 7 is a schematic diagram illustrating the constitution of another example of a roll-to-roll type film-forming apparatus according to the present invention.

In this example, using a roll-to-roll type film-forming apparatus shown in FIG. 7, as well as in the case of Example 1, the film formation for the web substrate was conducted. The roll-to-roll type film-forming apparatus shown in FIG. 7 is a partial modification of the apparatus shown in FIG. 5 used in Example 1, where the processing chamber 502 for the formation of the i-type layer in the apparatus is enlarged to have three processing spaces 104b–104d arranged therein.

The three processing spaces 104b–104d arranged in the processing chamber 502 enable to form an i-type semiconductor thin film having an excellent property at a relatively small deposition rate in each of the three processing spaces 104b–104d under the same film-forming conditions as shown in Table 5 whereby an i-type layer comprising three i-type semiconductor thin films stacked and having a relatively large thickness and which has excellent characteristics can be formed. The film-forming conditions adopted in this example are shown in Table 5.

In this example, the control of the inner pressures of the processing spaces 104b–104d was performed by maintaining the opening extent extents of the variable valves 109b–109b at the same opening extent extent using only a measured value by the pressure gage 104c for the processing space 104c. By this, the inner pressure of each of the processing spaces 104b–104d during the film formation could be maintained at a desired pressure value shown in Table 5. Similarly, the control of the inner pressures of the processing spaces 104e and 104f arranged in the processing chamber 502 for the formation of the p-type layer was performed by maintaining the opening extent extents of the variable valves 109e–109f at the same opening extent using only a measured value by the pressure gage 106e for the processing space 104e as well as in Example 1. By this, the inner pressure of each of the processing spaces 104e and 104e during the film formation could be maintained at a desired pressure value shown in Table 5.

In this example, as well as in the case of Example 1, after the film formation run was conducted 10 times in the sum, using the web substrate having the web substrate having the two-layered back reflecting layer and the pin junction structured semiconductor layer thereon obtained in the 10th film formation run, there were prepared a number of photovoltaic elements in the same manner as in Example 1.

Evaluation with respect to characteristics for the photovoltaic elements thus obtained was conducted by measuring a photoelectric conversion efficiency (η) under the irradiation of pseudo sunlight of AM 1.5 and with an energy density of 100 mW/cm₂ for each of the photovoltaic elements and obtaining an average value among the measured photoelectric conversion efficiencies of the photovoltaic elements. The average value of photoelectric conversion efficiency was to be greater than that obtained in Example 1.

Separately, for the web substrates having been subjected to the film formation in this example, their film-formed faces were examined. As a result, neither deposition of powder material nor cloudiness were observed for the web substrates examined.

EXAMPLE 4

The procedures of Example 3 using the apparatus shown in FIG. 7 were repeated, except that the flow rate (500 sccm) of the H₂ gas upon the formation of the i-type semiconductor film as the i-type layer in the third processing space 104d in Example 3 was changed to 1500 sccm and the wattage (150 W) of the RF power applied in the third processing space 104d upon the formation of the i-type semiconductor film as the i-type layer in the third processing space 104d in Example 1 was changed to 500 W. Since the third i-type layer forms an i/p interface with the p-type layer situated next thereto, by forming the third i-type layer under said conditions, the i/p interface between the third i-type layer and the p-type layer is more improved.

Specifically, in the processing space 104d, the dilution magnitude by the $H_2$ gas was enlarged and the wattage of the RF power applied was increased. And the flow rate and composition of the processing gas in the third processing space 104d were made to be different from those in the second processing space 104c situated next thereto. When the compositions of the processing gases in the adjacent processing spaces are different one from the other in this way, the relations between the opening extent extents of the variable valves and the pumping speeds of the exhaust gases passing through the variable valves become not to be of a definite ratio. In this connection, the opening extent extents and the pumping speeds of the variable valves 109b–109d were measured in advance, and they were approximated by a cubic equation. The approximate cubic equation was inputted in the control unit 111 corresponding to the processing chamber 502. Using only a measured pressure value by the pressure gage 106c corresponding to the processing space 104c and using the approximate cubic equation in the control unit 111, the opening extent extent of each of the variable valves 109b –109d was determined to control the inner pressures of the processing spaces 104b–104d. By this, the inner pressure of each of the processing spaces 104b–104d during the film formation could be maintained at a desired pressure value shown in Table 6.

The film-forming conditions adopted in this example are collectively shown in Table 6.

In this examples as well as in the case of Example 1, after the film formation run was conducted 10 times in the sum, the insides of the processing chambers 501–503 were examined. As a result it was found that the inner wall faces of each of the processing chambers 501–503 including the processing spaces 104a–104f were deposited with neither films nor by-products.

In this example, using the web substrate having the two-layered back reflecting layer and the pin junction structured semiconductor layer thereon obtained in the 10th film formation run, there were prepared a number of photovoltaic elements in the same manner as in Example 1.

Evaluation with respect to characteristics for the photovoltaic elements thus obtained was conducted by measuring a photoelectric conversion efficiency (η) under the irradiation of pseudo sunlight of AM 1.5 and with an energy density of 100 mW/cm$^2$ for each of the photovoltaic elements and obtaining an average value among the measured photoelectric conversion efficiencies of the photovoltaic elements. The average value of photoelectric conversion efficiency obtained was to be greater than that obtained in Example 1.

From the above description, it is understood that the present invention provides such significant advantages as will be described below.

That is, using a control means of deciding an opening extent of each of variable valves connected to a plurality of substrate processing spaces communicated with each other and using a measured pressure value in one of said substrate processing spaces, the opening extent extents of the variable valves connected to the substrate-processing spaces can be determined, where by together operating the variable valves, the flows of processing gases in the substrate-processing spaces can be optimized. This situation enables to continuously obtain a processed substrate product having excellent characteristics.

Further, it is possible to realize an improved substrate-processing method including an improved film-forming method and an improved substrate-processing apparatus including an improved film-forming apparatus which enable to stably and continuously form a high quality and highly reliable deposited film having excellent and uniform characteristics at a reasonable production cost.

This situation enables to efficiently mass-produce a high quality and highly reliable photovoltaic element which excels in characteristics.

In addition, according to the present invention, it is possible to stably and continuously form a high quality and highly reliable functional deposited film having excellent characteristics which are maintained over a long period of time without being deteriorated and having a high productivity at a reasonable production cost while preventing occurrence of by-products, wherein for a fabrication apparatus used, the maintenance frequency therefor is decreased and the rate of operation is improved This situation enables to efficiently mass-produce a high quality and highly reliable photovoltaic element which excels in characteristics at a reasonable production cost.

TABLE 1

| processing space | name of layer formed: thickness (nm) | gas used: flow rate (sccm) | inner pressure (Torr) | effective power applied (W) | substrate temperature (° C.) | film deposition rate (nm/sec) |
| --- | --- | --- | --- | --- | --- | --- |
| 104 a | n-type layer: 20 nm | SiH$_4$: 100<br>H$_2$: 1000<br>PH$_3$/H$_2$ (PH$_3$:2%): 150 | 1.0 | RF: 400 | 300 | 1.2 |
| 104 b | i-type layer: 80 nm | SiH$_4$: 200<br>H$_2$: 500 | 1.0 | RF: 200 | 350 | 0.6 |
| 104 c | p-type layer: 3 nm | SiH$_4$: 20<br>H$_2$: 3000<br>PF$_3$/H$_2$ (PF$_3$:2%): 30 | 1.0 | RF: 1000 | 300 | 0.2 |
| 104 d | p-type layer: 3 nm | SiH$_4$: 20<br>H$_2$: 3000<br>PF$_3$/H$_2$ (PF$_3$:2%): 30 | 1.0 | RF: 1000 | 300 | 0.2 |

TABLE 2

| | photoelectric conversion efficiency (η) |
|---|---|
| Example 1 | 4.7% |
| Comparative Example 1 | 3.9% |

TABLE 3

| processing space | name of layer formed: thickness (nm) | gas used: flow rate (sccm) | inner pressure (Torr) | effective power applied (W) | substrate temperature (° C.) | film deposition rate (nm/sec) |
|---|---|---|---|---|---|---|
| 104 a | n-type layer: 20 nm | SiH$_4$: 100<br>H$_2$: 1000<br>PH$_3$/H$_2$ (PH$_3$:2%): 150 | 1.0 | RF: 400 | 300 | 1.2 |
| 104 b | i-type layer: 80 nm | SiH$_4$: 200<br>H$_2$: 500 | 1.0 | RF: 200 | 350 | 0.6 |
| 104 c | p-type layer: 1.6 nm | SiH$_4$: 20<br>H$_2$: 1500<br>PF$_3$/H$_2$ (PF$_3$:2%): 15 | 1.0 | RF: 1000 | 300 | 0.1 |
| 104 d | p-type layer: 3 nm | SiH$_4$: 20<br>H$_2$: 3000<br>PF$_3$/H$_2$ (PF$_3$:2%): 30 | 1.0 | RF: 1000 | 300 | 0.2 |

TABLE 4

| | photoelectric conversion efficiency (η) |
|---|---|
| Example 1 | 4.9% |
| Comparative Example 1 | 4.1% |

TABLE 5

| processing space | name of layer formed: thickness (nm) | gas used: flow rate (sccm) | inner pressure (Torr) | effective power applied (W) | substrate temperature (° C.) | film deposition rate (nm/sec) |
|---|---|---|---|---|---|---|
| 104 a | n-type layer: 20 nm | SiH$_4$: 100<br>H$_2$: 1000<br>PH$_3$/H$_2$ (PH$_3$:2%): 150 | 1.0 | RF: 400 | 300 | 1.2 |
| 104 b | i-type layer: 35 nm | SiH$_4$: 120<br>H$_2$: 500 | 1.0 | RF: 150 | 350 | 0.3 |
| 104 c | i-type layer: 35 nm | SiH$_4$: 120<br>H$_2$: 500 | 1.0 | RF: 150 | 350 | 0.3 |
| 104 d | i-type layer: 35 nm | SiH$_4$: 120<br>H$_2$: 500 | 1.0 | RF: 150 | 350 | 0.3 |
| 104 e | p-type layer: 3 nm | SiH$_4$: 10<br>H$_2$: 1500<br>PF$_3$/H$_2$ (PF$_3$:2%): 15 | 1.0 | RF: 1000 | 300 | 0.1 |

TABLE 5-continued

| processing space | name of layer formed: thickness (nm) | gas used: flow rate (sccm) | inner pressure (Torr) | effective power applied (W) | substrate temperature (° C.) | film deposition rate (nm/sec) |
|---|---|---|---|---|---|---|
| 104 f | p-type layer 3 nm | SiH$_4$: 20<br>H$_2$: 3000<br>PF$_3$/H$_2$<br>(PF$_3$:2%): 30 | 1.0 | RF: 1000 | 300 | 0.2 |

TABLE 6

| processing space | name of layer formed: thickness (nm) | gas used: flow rate (sccm) | inner pressure (Torr) | effective power applied (W) | substrate temperature (° C.) | film deposition rate (nm/sec) |
|---|---|---|---|---|---|---|
| 104 a | n-type layer: 20 nm | SiH$_4$: 100<br>H$_2$: 1000<br>PH$_3$/H$_2$<br>(PH$_3$:2%): 150 | 1.0 | RF: 400 | 300 | 1.2 |
| 104 b | i-type layer: 35 nm | SiH$_4$: 120<br>H$_2$: 500 | 1.0 | RF: 150 | 350 | 0.3 |
| 104 c | i-type layer: 35 nm | SiH$_4$: 120<br>H$_2$: 500 | 1.0 | RF: 150 | 350 | 0.3 |
| 104 d | i-type layer: 20 nm | SiH$_4$: 120<br>H$_2$: 1500 | 1.0 | RF: 500 | 350 | 0.2 |
| 104 e | p-type layer: 3 nm | SiH$_4$: 10<br>H$_2$: 1500<br>PF$_3$/H$_2$<br>(PF$_3$:2%): 15 | 1.0 | RF: 1000 | 300 | 0.1 |
| 104 f | p-type layer 3 nm | SiH$_4$: 20<br>H$_2$: 3000<br>PF$_3$/H$_2$<br>(PF$_3$:2%): 30 | 1.0 | RF: 1000 | 300 | 0.2 |

What is claimed is:

1. A substrate-processing method comprising:
   transporting a substrate to pass through a plurality of processing spaces communicated with each other while processing said substrate in each of said plurality of processing spaces; and
   controlling an inner pressure of a processing space (a), which is one of said processing spaces, and of at least one processing space (b), arranged before or after said processing space (a), based on an inner pressure of said processing space (a).

2. A substrate-processing method according to claim 1, wherein the control of the inner pressure of the processing space (a) and that of the processing space (b) is performed by controlling a pumping speed of exhausting each of these processing spaces.

3. A substrate-processing method according to claim 2, wherein the pumping speed of each of the processing spaces is controlled by regulating an extent to which an exhaust valve provided at an exhaust pipe connected to each processing space is opened.

4. A substrate-processing method according to claim 3, further comprising opening the exhaust valves to the same extent.

5. A substrate-processing method according to claim 3, further comprising controlling the extent to which the exhaust valves are open to attain a prescribed ratio among them.

6. A substrate-processing method according to claim 1, wherein the processing space (a) and the processing space (b) are arranged in a common processing chamber.

7. A substrate-processing method according to claim 1, wherein the processing space (a) and the processing space (b) are communicated with each other through a gas gate.

8. A substrate-processing method according to claim 1, wherein the processing of the substrate includes film-forming treatment.

9. A substrate-processing method according to claim 8, wherein the treatment includes sputtering.

10. A substrate-processing method according to claim 8, wherein the treatment includes CVD.

11. A substrate-processing method according to claim 1, wherein the substrate comprises a web substrate.

12. A substrate-processing apparatus comprising:
   a plurality of processing spaces;
   a substrate transportation means for transporting a substrate to pass through said plurality of processing spaces while said substrate is being processed in each processing space;
   a pressure gage for measuring an inner pressure of a processing space (a), which is one of said processing spaces; and
   a control unit for controlling the inner pressure of said processing space (a) and that of at least one processing space (b), arranged before or after said processing space (a), based on information obtained from said pressure gage.

13. A substrate-processing apparatus according to claim 12, wherein each of said plurality of processing spaces is provided with an exhaust pipe having a variable valve, and said control unit serves to directly or indirectly control an opening extent of each variable valve.

14. A substrate-processing apparatus according to claim 13, wherein a pressure controller is connected to each variable valve, said pressure controller being for regulating the opening extent of said variable valve, and the opening extent of each variable valve is regulated by the pressure controller connected thereto based on a signal transmitted from said control unit.

15. A substrate-processing apparatus according to claim 12, wherein said processing space (a) and said processing space (b) are arranged in a common processing chamber.

16. A substrate-processing apparatus according to claim 12, wherein said processing space (a) and said processing space (b) are communicated with each other through a gas gate.

17. A substrate-processing apparatus according to claim 12, wherein at least one of said plurality of processing spaces is provided with a film-forming means.

18. A substrate-processing apparatus according to claim 17, wherein said film-forming means comprises a processing gas supply means and a power supply means.

19. A substrate-processing apparatus according to claim 17, wherein said film-forming means comprises sputtering means.

20. A substrate-processing apparatus according to claim 17, wherein said film-forming means comprises CVD means.

* * * * *

UNITED STATES PATENT AND TRADEMARK OFFICE
CERTIFICATE OF CORRECTION

PATENT NO. : 6,576,061 B1
DATED : June 10, 2003
INVENTOR(S) : Koichiro Moriyama et al.

It is certified that error appears in the above-identified patent and that said Letters Patent is hereby corrected as shown below:

Column 1,
Line 34, "4,400,409" should read -- 4,400,409. --;
Line 34, "this" should read -- This --;
Line 36, "chambers:" should read -- chambers --;
Line 46, "fox" should read -- for --; and
Line 66, "of constituting" should read -- constituting --.

Column 2,
Line 6, "one-processing" should read -- one processing --;
Line 21, "condition." should read -- conditions. --; and
Line 29, "Separately;" should read -- Separately, --.

Column 5,
Line 13, "An" should read -- A --;
Line 24, "of," should read -- of --; and
Line 29, "an" should read -- an inner --.

Column 6,
Line 5, "an" (second occurrence) should read -- a --;
Line 12, "Is" should read -- is --; and
Line 55, "comprises" should read -- comprise --.

Column 7,
Line 19, "means)" should read -- means). --; and
Line 25, "comprises" should read -- comprise --.

Column 8,
Line 22, "10c." should read -- 110c. --.

Column 10,
Line 51, "he" should read -- the --.

Column 11,
Line 7, "heater 165" should read -- heater 105 --;
Line 40, "In" should read -- in --; and
Line 52, "Introduced" should read -- introduced --.

UNITED STATES PATENT AND TRADEMARK OFFICE
CERTIFICATE OF CORRECTION

PATENT NO. : 6,576,061 B1
DATED : June 10, 2003
INVENTOR(S) : Koichiro Moriyama et al.

It is certified that error appears in the above-identified patent and that said Letters Patent is hereby corrected as shown below:

Column 12,
Line 29, "m-maintaining" should read -- maintaining --;
Line 29, "form" should read -- form. --;
Line 31, "forming" should read -- film forming --;
Line 32, "Is In" should read -- is in --;
Line 37, "form" should read -- to form --; and
Line 43, "influence" should read -- influenced --.

Column 13,
Line 13, "comprises" should read -- comprise --;
Line 21, "polyimide," (second occurrence) should read -- polyamide --; and
Line 48, "inventions" should read -- invention, --.

Column 14,
Line 5, "pipes" should read -- pipe, --; and
Line 13, "a is" should read -- a --.

Column 16,
Line 34, "he web" should read -- the web --;
Line 36, "fluorescing" should read -- fluororesin --; and
Line 59, "structure-was" should read -- structure was --.

Column 17,
Line 55, "scam." should read -- sccm. --.

Column 18,
Line 3, "RE" should read -- RF --;
Line 11, "a 80 nm" should read -- an 80 nn --;
Line 32, "sauce" should read -- same --;
Line 38, "fox" should read -- for --; and
Line 47, "substrate-take up" should read -- substrate take-up --.

Column 19,
Line 9, "a 800" should read -- an 800 --;
Line 40, "valve 104c" should read -- valve 109c --;
Line 43, "valve 104d" should read -- valve 109d --;
Line 45, "gage 104d" should read -- gage 106d --; and
Line 65, "was 1:1" should read -- was 1:1.1 --.

UNITED STATES PATENT AND TRADEMARK OFFICE
CERTIFICATE OF CORRECTION

PATENT NO. : 6,576,061 B1
DATED : June 10, 2003
INVENTOR(S) : Koichiro Moriyama et al.

It is certified that error appears in the above-identified patent and that said Letters Patent is hereby corrected as shown below:

Column 20,
Line 11, "14th film" should read -- 10th film --;
Line 41, "were-observed." should read -- were observed. --;
Line 51, "104d were" should read -- 109d were --; and
Line 56, "gage 104c," should read -- gage 106c, --.

Column 21,
Line 44, "the film" should read -- to the film --; and
Line 46, "wed" should read -- web --.

Column 22,
Line 14, "109b-109b" should read -- 109b-109d --;
Line 14, "extent extent" should read -- extent extents --;
Line 15, "gage 104c" should read -- gage 106c --; and
Line 41, "100mW/cm$_2$" should read -- 100mW/cm$^2$ --.

Column 23,
Line 28, "this examples" should read -- this example, --.

Column 24,
Line 40, "improved" should read -- improved. --.

Signed and Sealed this

Third Day of February, 2004

JON W. DUDAS
*Acting Director of the United States Patent and Trademark Office*